(12) United States Patent
Komatsu et al.

(10) Patent No.: US 10,536,141 B2
(45) Date of Patent: Jan. 14, 2020

(54) SEMICONDUCTOR DEVICE

(71) Applicant: Hitachi Automotive Systems, Ltd., Hitachinaka-shi, Ibaraki (JP)

(72) Inventors: Shigenobu Komatsu, Hitachinaka (JP); Kentarou Miyajima, Hitachinaka (JP); Hiroshi Onuki, Hitachinaka (JP); Junji Onozuka, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 58 days.

(21) Appl. No.: 15/518,189

(22) PCT Filed: Sep. 18, 2015

(86) PCT No.: PCT/JP2015/076599
§ 371 (c)(1),
(2) Date: Apr. 10, 2017

(87) PCT Pub. No.: WO2016/063666
PCT Pub. Date: Apr. 28, 2016

(65) Prior Publication Data
US 2018/0241388 A1    Aug. 23, 2018

(30) Foreign Application Priority Data
Oct. 24, 2014   (JP) .................... 2014-216815

(51) Int. Cl.
*H03L 7/00* (2006.01)
*H03K 17/22* (2006.01)
(Continued)

(52) U.S. Cl.
CPC ............... *H03K 17/22* (2013.01); *G06F 1/24* (2013.01); *G06F 1/305* (2013.01)

(58) Field of Classification Search
CPC ....... Y02T 10/7005; G01R 31/40; G06F 1/26; H01L 2924/00; H01L 2924/0002;
(Continued)

(56) References Cited

U.S. PATENT DOCUMENTS 6,459,245 B1 * 10/2002 Mader ..................... G01P 15/08
323/266
2004/0056665 A1 * 3/2004 Iwanaga .......... G01R 19/16538
324/522
(Continued)

FOREIGN PATENT DOCUMENTS

JP      59-135038 U      9/1984
JP       5-66729 U       9/1993
(Continued)

OTHER PUBLICATIONS

Extended European Search Report issued in counterpart European Application No. 15853365.3 dated Apr. 6, 2018 (nine (9) pages).
(Continued)

*Primary Examiner* — Sibin Chen
(74) *Attorney, Agent, or Firm* — Crowell & Moring LLP (57) ABSTRACT

The purpose of the present invention is to provide a semiconductor device that is small and has diagnosability, and that can quickly recover from power source malfunctions. Provided is a semiconductor device that includes: a control signal generation circuit that generates control signals which differ according to the fluctuation time of power-source voltage; and a control circuit that changes an operation sequence according to the differences in the control signals.

7 Claims, 9 Drawing Sheets

(51) Int. Cl.
*G06F 1/30* (2006.01)
*G06F 1/24* (2006.01)

(58) Field of Classification Search
CPC . H01L 2924/00014; H01L 2224/73204; H01L 2224/32225
See application file for complete search history.

(56) References Cited

U.S. PATENT DOCUMENTS

| | | | | |
|---|---|---|---|---|
| 2007/0001720 A1* | 1/2007 | Li | ............................ | G06F 1/28 327/143 |
| 2010/0088503 A1* | 4/2010 | Eto | ......................... | G06F 1/30 713/100 |
| 2010/0131811 A1* | 5/2010 | Eto | ..................... | G11C 16/225 714/721 |

FOREIGN PATENT DOCUMENTS

| | | |
|---|---|---|
| JP | 9-258863 A | 10/1997 |
| JP | 2012-245041 A | 12/2012 |

OTHER PUBLICATIONS

International Search Report (PCT/ISA/210) issued in PCT Application No. PCT/JP2015/076599 dated Jan. 12, 2016 with English translation (five (5) pages).
Japanese-language Written Opinion (PCT/ISA/237) issued in PCT Application No. PCT/JP2015/076599 dated Jan. 12, 2016 (four (4) pages).

* cited by examiner

SEMICONDUCTOR DEVICE

TECHNICAL FIELD

The present invention relates to a semiconductor device and more specifically relates to a semiconductor device to be mounted on an automobile.

BACKGROUND ART

The number of semiconductor devices to be mounted on an automobile is yearly increasing. Along with the increase, each of the semiconductor devices is required to have high safety. A means to improve safety is a self-diagnosis function of the semiconductor device, for example. The self-diagnosis function can be categorized into a regular diagnosis in which a diagnosis is performed periodically during the operation and an initial diagnosis in which a diagnosis is performed only when the power is turned on. In the initial diagnosis, a diagnosis that requires time in a diagnosing operation and that is hard to be performed at the same time as the normal operation is performed in usual cases.

PTL 1 describes a configuration of a game machine that regularly diagnoses power abnormality at the time of a power failure or the like with use of a power failure detecting circuit and a backup power supply provided externally.

CITATION LIST

Patent Literature

PTL 1: JP 2012-245041 A

SUMMARY OF INVENTION

Technical Problem

The semiconductor device is required to have not only safety but also prompt recovery to the normal operation from the power abnormality. The reason for this is that the semiconductor device in the automobile is used in an environment susceptible to a power noise but cannot stop a control operation thereof. However, in a case in which the initial diagnosis in the power-on case requires time, this prevents the prompt recovery from the power abnormality. The reason for this is that, since the semiconductor device itself cannot recognize whether the power has been turned on again or power-supply voltage has decreased due to power abnormality, the initial diagnosing operation is performed in the power abnormality case in a similar manner to that in the power-on case.

In PTL 1, the power abnormality at the time of the power failure is detected with use of the power failure detecting circuit and the backup power supply to distinguish between the power-on and the power abnormality. However, mounting the power failure detecting circuit and the backup power supply described in PTL 1 as external parts require a large area and high cost.

An object of the present invention is to provide a semiconductor device that is small in size and that has a diagnosing function.

Solution to Problem

A semiconductor device according to the present invention includes, for example, a control signal generating circuit that generates a different control signal depending on fluctuation time of power-supply voltage, and a control circuit that changes an operation sequence depending on the difference of the control signal.

Advantageous Effects of Invention

According to the present invention, a semiconductor device that is small in size and that has a diagnosing function can be provided.

DESCRIPTION OF EMBODIMENTS

In a configuration according to the present invention, a power-on case and a power abnormality case are distinguished from each other by fluctuation time of power-supply voltage. Hereinbelow, embodiments of the present invention will be described in detail with reference to the drawings.

First Embodiment

Figure 1:
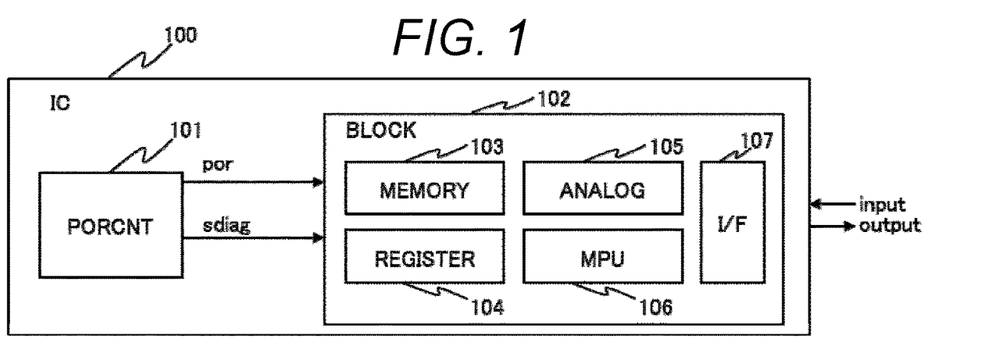
FIG. 1 is a block diagram of a semiconductor device according to the present invention.

FIG. 1 illustrates a configuration example of a semiconductor device according to the present invention. An IC 100 is a semiconductor chip, and a PORCNT 101 is a circuit that generates a power-on reset signal por and a distinguishing signal sdiag between a power-on case and a power abnormality case. A BLOCK 102 is a set of other circuit blocks controlled by por and sdiag. A MEMORY 103 is a memory circuit such as a non-volatile memory, an SRAM, and a DRAM, a REGISTER 104 is a register circuit, an ANALOG 105 is an analog circuit, an MPU 106 is a microprocessor unit, and an I/F 107 is an input/output circuit from/to an external unit of the chip.

Figure 2:
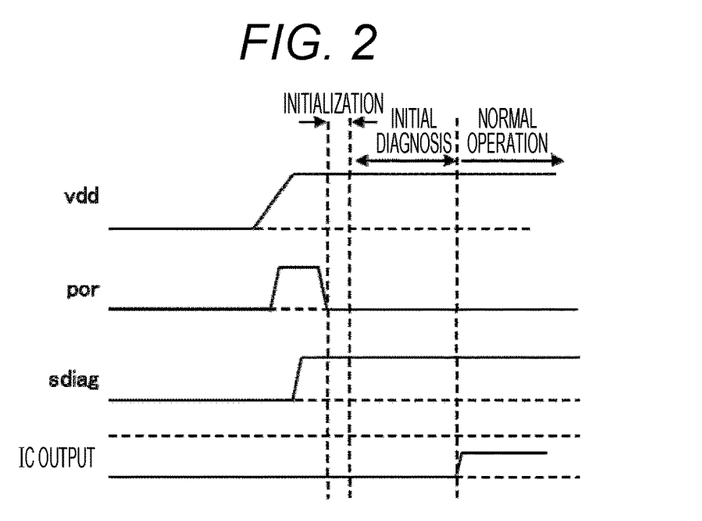
FIG. 2 illustrates operation waveforms of the block diagram illustrated in FIG. 1 in a power-on case.

FIG. 2 illustrates operation waveforms in the power-on case. When the power is turned on, and voltage vdd rises, the power-on reset signal por is generated. When por gets high, a value of the register in the BLOCK 102 is reset. When por gets low, the MPU 106 starts an operation and performs initialization such as reading out data in the memory to the register. After the initialization, in a case in which the control signal sdiag is high, the MPU performs an initial diagnosing operation and then starts a normal operation.

Figure 3:
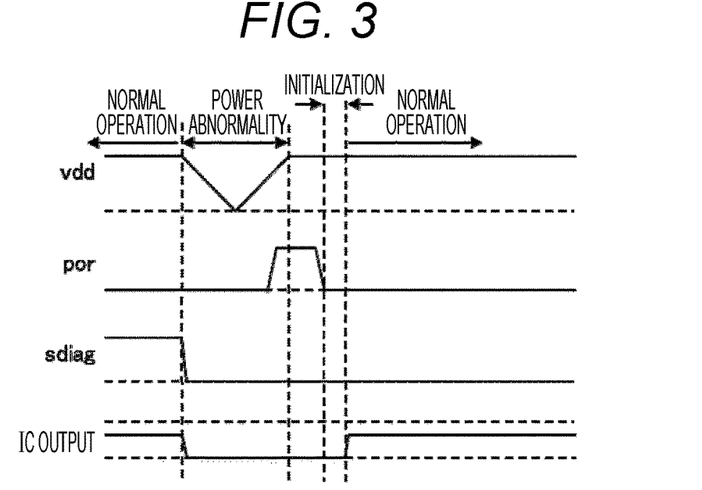
FIG. 3 illustrates operation waveforms of the block diagram illustrated in FIG. 1 in a power abnormality case.

FIG. 3 illustrates operation waveforms in the power abnormality case. The power-on reset signal por is generated in a similar manner to that in the power-on case, and the MPU 106 performs the initialization. After the initialization, in a case in which the control signal sdiag is low, the MPU moves to the normal operation without performing the initial diagnosing operation.

In this manner, whether or not the initial diagnosis is performed is controlled by absence/presence of sdiag. Also, the reason why por is generated to cause the initialization to be performed even in the power abnormality case is that the power abnormality may break the value of the register and cause malfunction.

Figure 4:
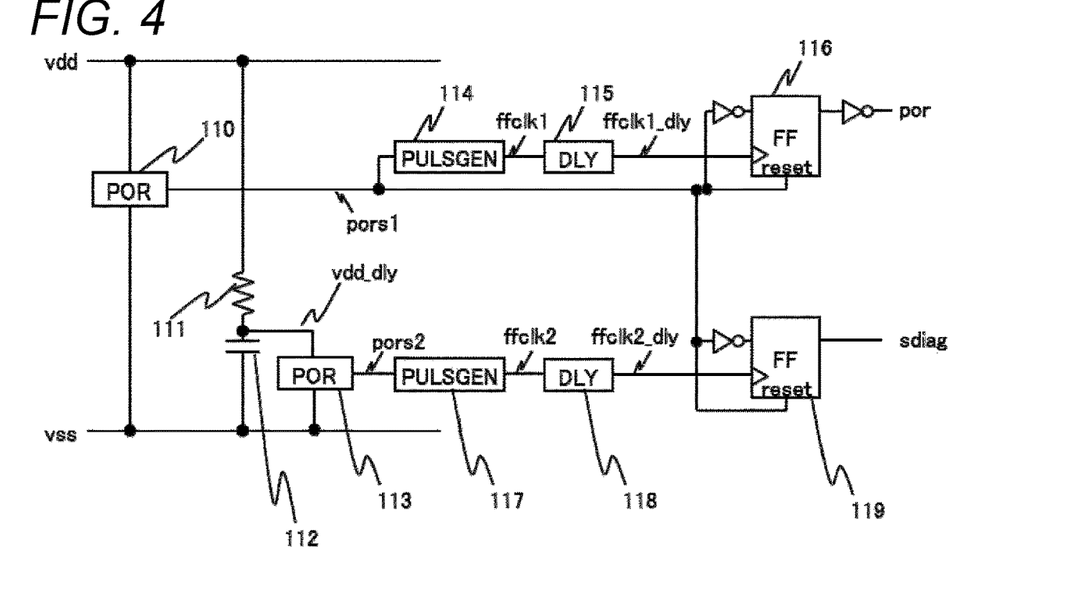
FIG. 4 illustrates an example of a circuit for distinguishing between the power-on case and the power abnormality case.

Next, an example of the PORCNT 101 serving as a circuit that generates por and sdiag will be illustrated. FIG. 4 illustrates a circuit diagram of the PORCNT 101. A POR 110 outputs a high-value signal (=vdd) to pors1 when the power-supply voltage vdd is equal to or less than voltage vreleas and outputs a low-value signal to pors1 when vdd is equal to or more than vreleas. A POR 113 is also operated similarly to the POR 110 and is provided with vdd_dly instead of vdd. The signal vdd_dly rises later than vdd as much as RC time constant of a resistor 111 and a capacitor 112. Each of a PULSGEN 114 and a PULSGEN 117 outputs a high pulse having a certain width to a falling edge of an input signal. Each of a DLY 115 and a DLY 118 is a delay circuit. Each of an FF 116 and an FF 119 is a flip-flop circuit. When reset input in the FF is high, retained data is reset. When the data is reset, an output signal gets low. At a rising edge of a clock signal, input data is taken in and output. Power supplies of the circuits other than the POR 113 are connected to vdd.

Figure 5:
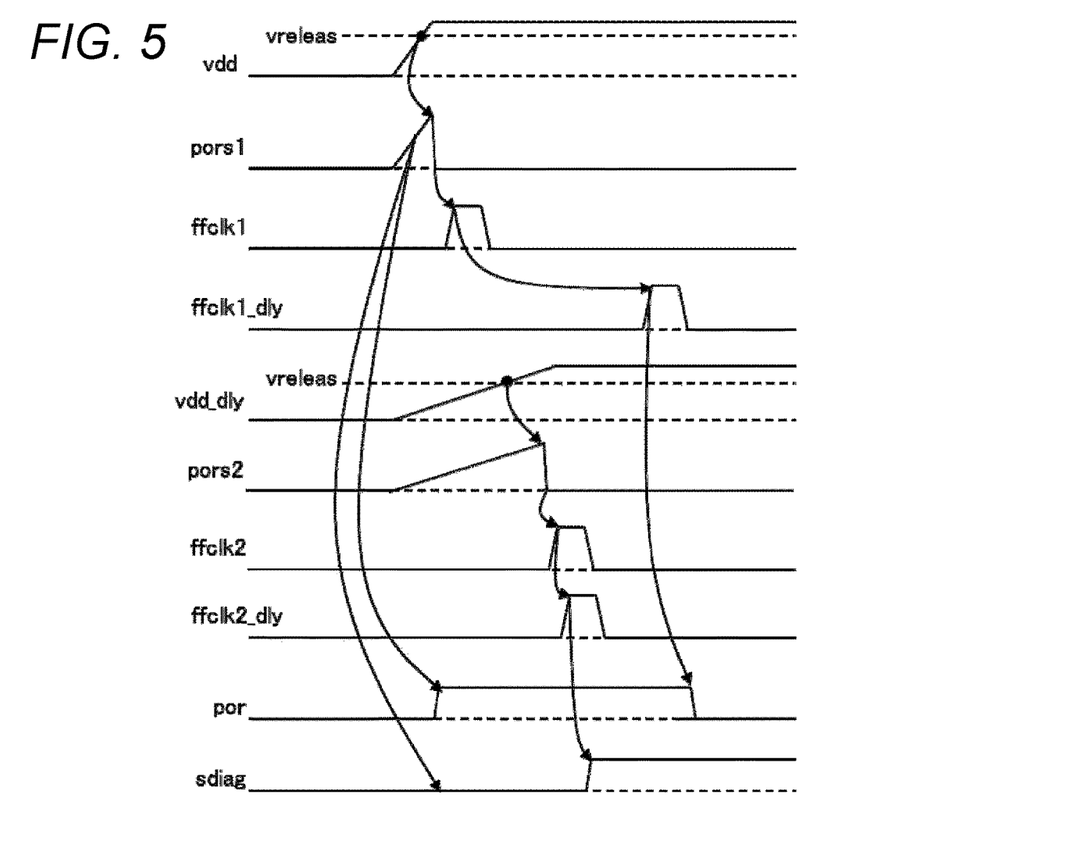
FIG. 5 illustrates operation waveforms of the circuit diagram illustrated in FIG. 4 in the power-on case.

FIG. 5 illustrates a waveform chart in the power-on case. First, when the power-supply voltage vdd rises, the POR 110 outputs a high-value signal (=vdd) to pors1. When pors1 gets high, the FF 116 and the FF 119 are in reset states and output low-value signals. When the output signals of the FF 116 and the FF 119 get low, por gets high, and sdiag gets low. When vdd gets higher than vreleas, pors1 gets low. When a falling edge of pors1 is input, the PULSGEN 114 generates a pulse signal ffclk1, and a delay signal ffclk1_dly of ffclk1 is input as a clock signal of the FF 116. Since an inversion signal of pors1 is input in the FF 116, an output of the FF 116 gets high, and por gets low. The signal vdd_dly rises later than vdd due to the resistor 111 and the capacitor 112. When vdd_dly rises, the POR 113 outputs a high-value signal (=vdd_dly) to pors2. When vdd_dly gets higher than vreleas, pors2 gets low. When a falling edge of pors2 is input, the PULSGEN 117 generates a pulse signal ffclk2, and a delay signal ffclk2_dly of ffclk2 is input as a clock signal of the FF 119. Since an inversion signal of pors2 is input in the FF 119, sdiag serving as an output of the FF 119 gets high. The DLY 115 is provided to assure that whether sdiag is low or high is determined when por gets low, and when the circuits in the BLOCK 102 start operations. Thus, the delay amount of the DLY 115 depends on the delay amount of vdd_dly against vdd.

Figure 6:
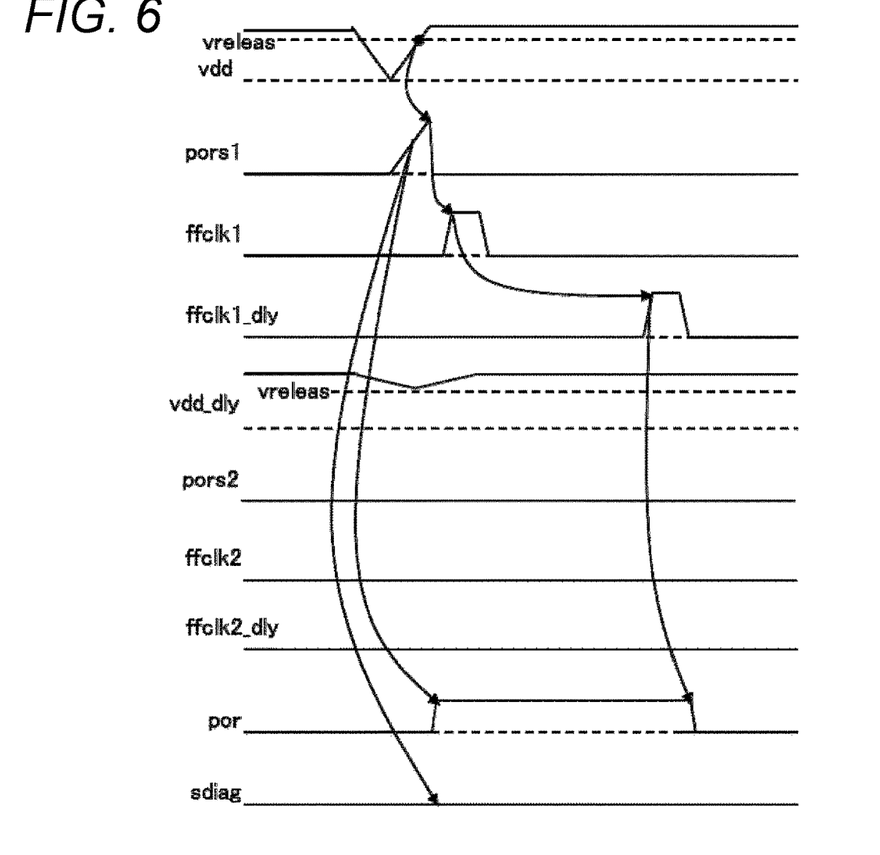
FIG. 6 illustrates operation waveforms of the circuit diagram illustrated in FIG. 4 in the power abnormality case.

FIG. 6 illustrates a waveform chart in the power abnormality case. When the power-supply voltage vdd rises, pors1 gets high. Thus, reset signals are input in the FF 116 and the FF 119, and por gets high while sdiag gets low. When vdd gets higher than vreleas, pors1 gets low. When a falling edge of pors1 is input, the PULSGEN 114 generates the pulse signal ffclk1, and a delay signal ffclk1_dly of ffclk1 is input as a clock signal of the FF 116. Since an inversion signal of pors1 is input in the FF 116, an output of the FF 116 gets high, and por gets low. The above operations are similar to those in the power-on case. However, in the power abnormality case, since a period in which vdd is low is short, vdd_dly does not get lower than vreleas. Since vdd_dly does not get lower than vreleas, pors2 keeps low, and ffclk2 and ffclk2_dly do not change. Since no clock signal is input in the FF 119, sdiag keeps low.

The power supply drop time for use in determination of power abnormality is determined by values of the resistor 111 and the capacitor 112.

According to the present embodiment, in the power abnormality case, the fluctuation time of power-supply voltage is short since the power abnormality is caused by noise and chattering of a connector, and in the power-on case, a power-off period and rising time of the power supply are longer than those in the power abnormality case. Accordingly, operations can be switched based on the difference of the fluctuation time of the power-supply voltage in the power abnormality case from that in the power-on case. By switching operations not to perform the initial diagnosis in the power abnormality case, recovery time from power abnormality to a normal operation can be shortened.

Second Embodiment

Figure 7:
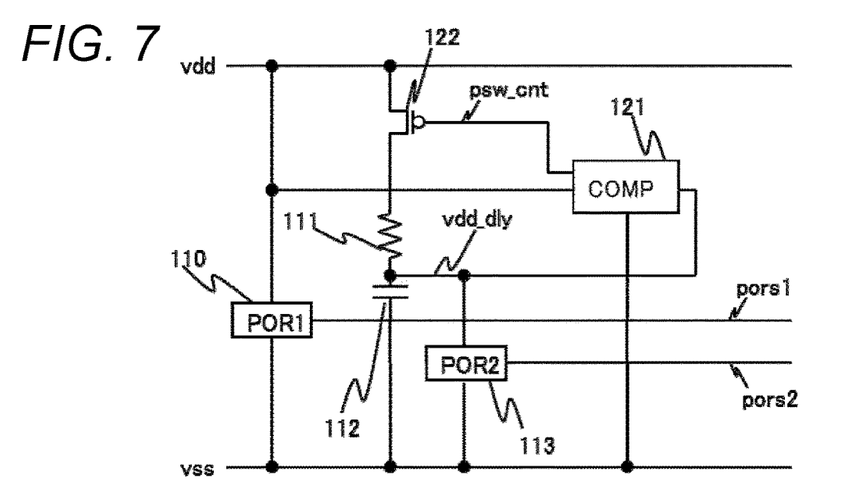
FIG. 7 illustrates an example of a circuit for distinguishing between the power-on case and the power abnormality case.
Figure 8:
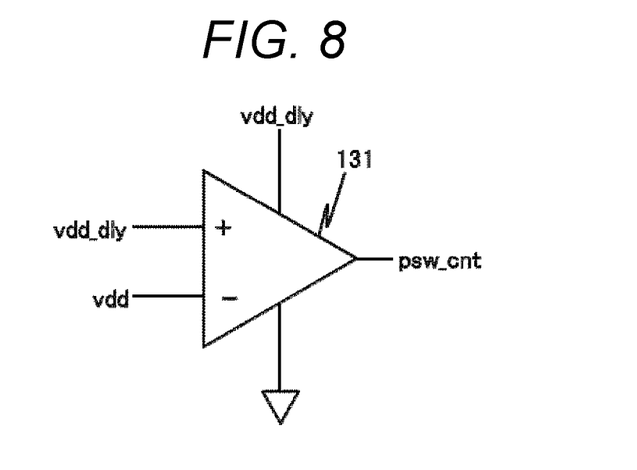
FIG. 8 illustrates an example of a circuit of a COMP in the circuit diagram illustrated in FIG. 7.

The voltage decrease time in the power abnormality case for use in distinguishing between the power abnormality case and the power-on case in the first embodiment is determined by time constant of the resistor 111 and the capacitor 112. In a case in which the values of the resistor 111 and the capacitor 112 are increased, the power supply fluctuation having longer voltage decrease time can facilitate distinction from the power-on case, but the activation time is longer because timing at which sdiag is determined is later. Also, since the resistor 111 needs to supply current at which the POR 113 is operable, the value of the resistor 111 has an upper limit. To increase the time constant, the capacitance value of the capacitor 112 needs to be increased, but area overhead is large. FIG. 7 illustrates a configuration in which a switch and a comparator are used to enable resistance between vdd and vdd_dly to be changed in the power-on case and in the voltage decrease in the power abnormality case. Only differences from the first embodiment will be described. A PMOS switch 122 and a comparator COMP 121 are added to the first embodiment. The COMP 121 compares vdd with vdd_dly. When vdd is equal to or more than vdd_dly, the COMP 121 outputs a low-value signal to psw_cnt. When vdd is less than vdd_dly, the COMP 121 outputs a high-value signal to psw_cnt. An example of a configuration of the COMP 121 is illustrated in FIG. 8. A non-inverting input of an operational amplifier 131 is provided with vdd_dly, an inverting input is provided with vdd, and a power supply is provided with vdd_dly.

Figure 9:
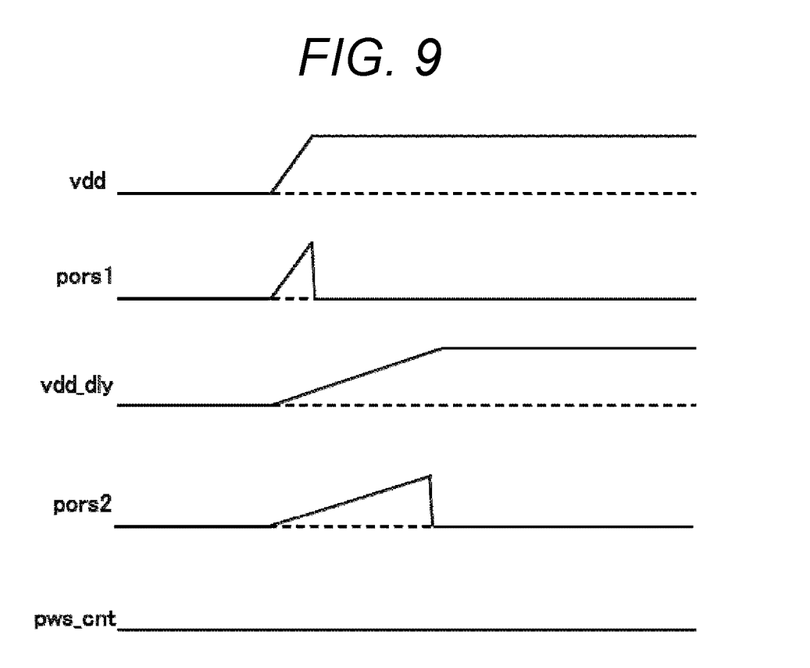
FIG. 9 illustrates operation waveforms of the circuit illustrated in FIG. 7 in the power-on case.
Figure 10:
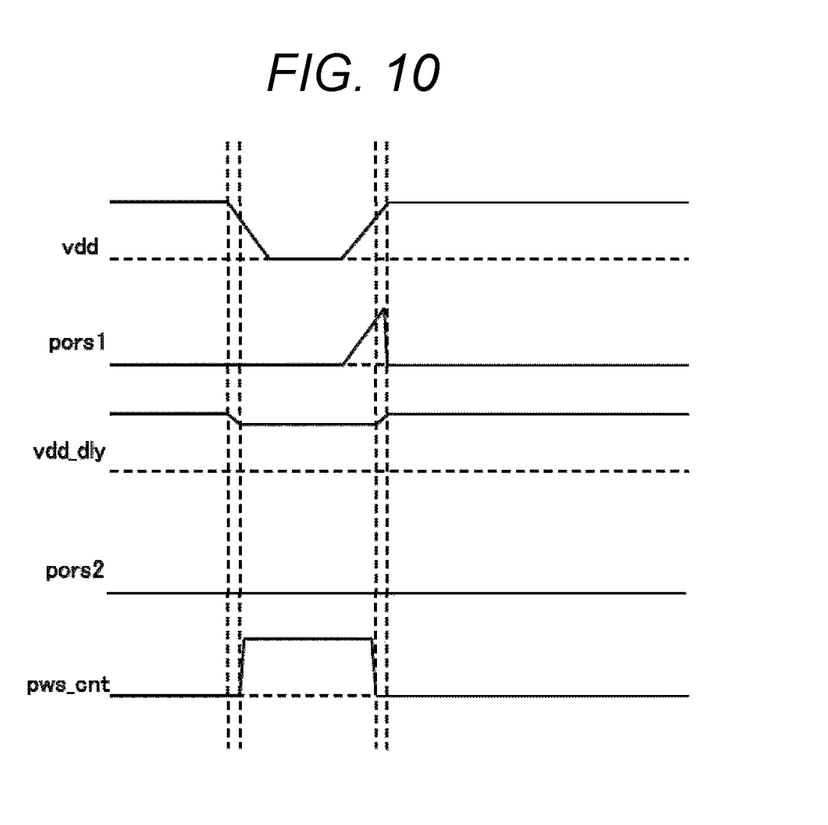
FIG. 10 illustrates operation waveforms of the circuit illustrated in FIG. 7 in the power abnormality case.

FIG. 9 illustrates operations in the power-on case. In the power-on case, since vdd is absolutely higher than vdd_dly, psw_cnt is low, and the PMOS switch 122 is in an on state. When on-resistance of the PMOS switch 122 is assumed to be sufficiently low, rising of vdd_dly is determined by the resistance value of the resistor 111 and the capacitance value of the capacitor 112. Next, FIG. 10 illustrates operations in the power abnormality case. In a case in which vdd falls due to the power abnormality, vdd_dly changes more slowly than vdd, and vdd_dly is thus higher than vdd. When vdd falls and gets lower than vdd_dly, psw_cnt gets high, and the PMOS switch 122 in in an off state. Since off-resistance of the PMOS switch 122 is three-or-more-digit lower than on-resistance, the time constant determined by the capacitor 112 and the off-resistance of the PMOS switch 122 can be three-or-more-digit higher than the time constant determined by the capacitor 112 and the on-resistance of the PMOS switch 122. According to the present embodiment, at the time of the power-supply voltage decrease, the PMOS switch 122 is in an off state and in a high-resistance state. Thus, the capacitance value of the capacitor 112 can be lower than in a case of using a normal resistor. Since the area is proportional to the capacitance value, the area of the capacitor 112 can be decreased, and a similar effect can be achieved with a smaller area than that in the first embodiment.

Third Embodiment

Figure 11:
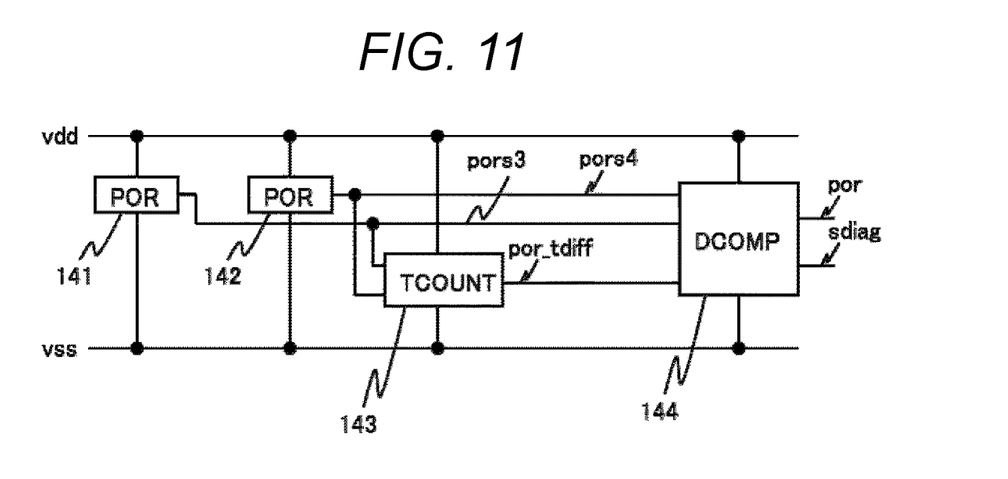
FIG. 11 illustrates an example of a circuit for distinguishing between the power-on case and the power abnormality case based on transition time of power-supply voltage.

FIG. 11 illustrates a circuit in which the power-on and the power abnormality are distinguished by a difference of rising time of power-supply voltage. Since voltage fluctuation time in the power abnormality case is shorter than rising time in the power-on case, the power-on and the power abnormality can be distinguished by the difference in the fluctuation time of the power-supply voltage. A POR 141 outputs a high-value signal to pors3 while vdd is equal to or less than por3_th and outputs a low-value signal to pors3 when vdd is more than por3_th. A POR 142 outputs a high-value signal to pors4 while vdd is equal to or less than por4_th and outputs a low-value signal to pors4 when vdd is more than por4_th. A TCOUNT 143 is a counter circuit and performs counting periodically during a period from falling of pors3 to falling of pors4 and in a period in which pors3 is low while pors4 is high. A DCOMP 144 is a digital value comparator. The DCOMP 144 compares an output por_tdiff of the TCOUNT 143 with a fixed value, and in a case in which the output is higher than the fixed value, the DCOMP 144 outputs a high-value signal to sdiag.

Figure 12:
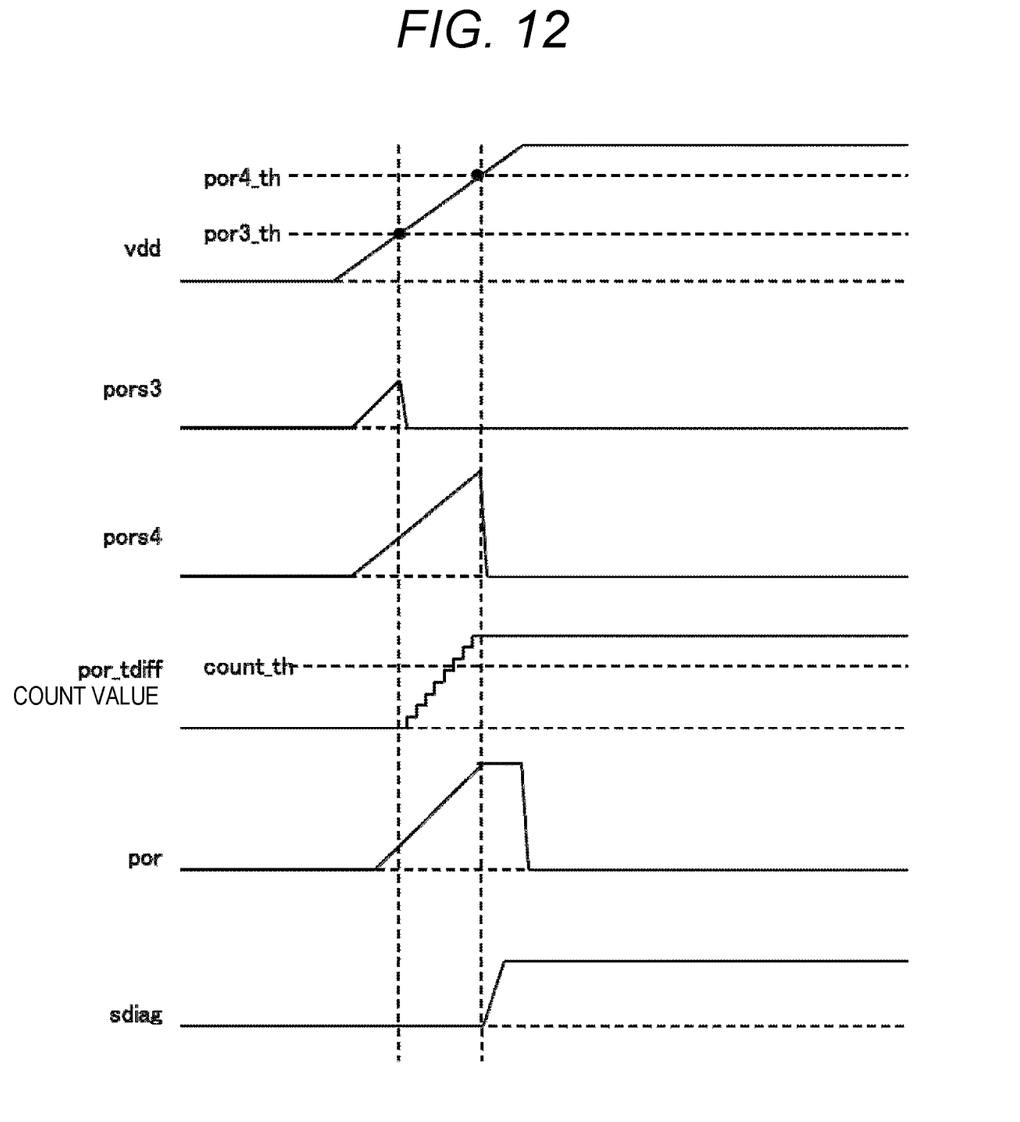
FIG. 12 illustrates operation waveforms of the circuit illustrated in FIG. 11 in the power-on case.

FIG. 12 illustrates operation waveforms in the power-on case. Along with rising of vdd, high-value signals (=vdd) are output to pors3 and pors4. When vdd is higher than por3_th, pors3 falls. Falling of pors3 causes pors3 to be low and causes pors4 to be high, the TCOUNT 143 starts counting, and a bit value of por_tdiff increases. When vdd gets higher than por4_th, pors4 falls, and the TCOUNT 143 stops counting. At time of falling of pors4, por_tdiff is compared with the fixed value count_th. Since por_tdiff is higher than count_th, a high-value signal is output to sdiag. A signal that has delayed falling timing of pors4 is output to por. The reason for this is to assure that sdiag is determined before the power-on reset is cancelled.

Figure 13:
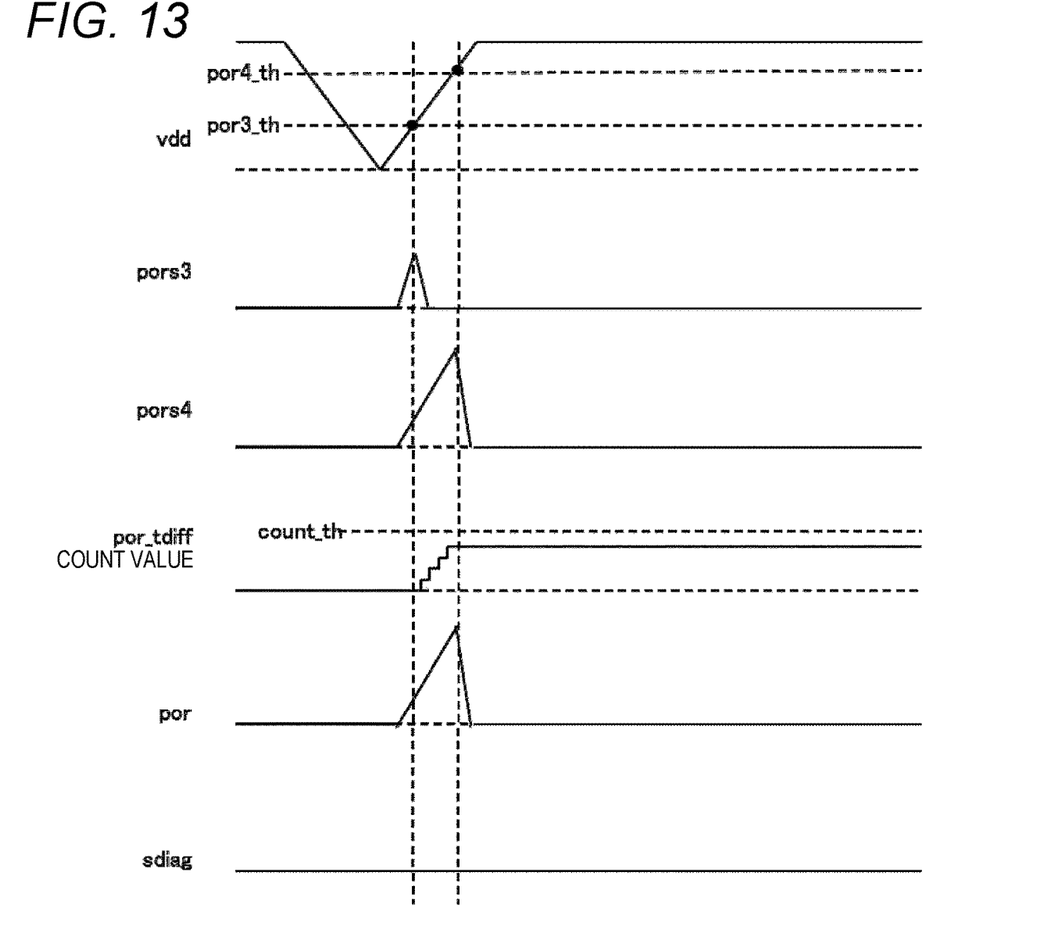
FIG. 13 illustrates operation waveforms of the circuit illustrated in FIG. 11 in the power abnormality case.

FIG. 13 illustrates operation waveforms in the power abnormality case. Since rising time of vdd is short, a period from falling of pors3 to falling of pors4 is short. Thus, the count value por_tdiff of the TCOUNT 143 is equal to or less than count_th, and sdiag keeps low.

The comparison value with por_tdiff in the power abnormality case may be changed per chip, using a fuse and a non-volatile memory. According to the present embodiment, in the power abnormality case, rising time of the power-supply voltage is short since the power abnormality is caused by noise and chattering of a connector, and in the power-on case, rising time of the power supply is longer than those in the power abnormality case. Accordingly, operations can be switched based on the difference of the rising time of the power supply in the power abnormality case from that in the power-on case.

According to the present embodiment, since the resistor and the capacitor can be dispensed with, switching of operations in the power abnormality case can be achieved with smaller area than that in the first or second embodiment. Also, in the first or second embodiment, in a case in which the power abnormality, in which power-supply voltage decrease time is long, is distinguished from the power-on, delay of vdd_dly against a change of the power-supply voltage vdd needs to be large. Thus, since it takes time to determine the power-on or the power abnormality, it takes time for recovery from the power abnormality. Conversely, in the present embodiment, determination can be performed when the power supply recovers normal operation voltage. Further, a case in which rising time of the power supply is longer than that in the power-on case can be detected as abnormality. An example of the case in which rising time of the power supply is longer is an increase of resistance caused by oxidation and contact failure of the power connector terminal.

Fourth Embodiment

As in the first embodiment, to determine the power abnormality with use of longer voltage decrease time, delay of vdd_dly against a change of the power-supply voltage vdd needs to be large. Thus, since it takes time to determine the power-on or the power abnormality, it takes time for recovery from the power abnormality.

Figure 14:
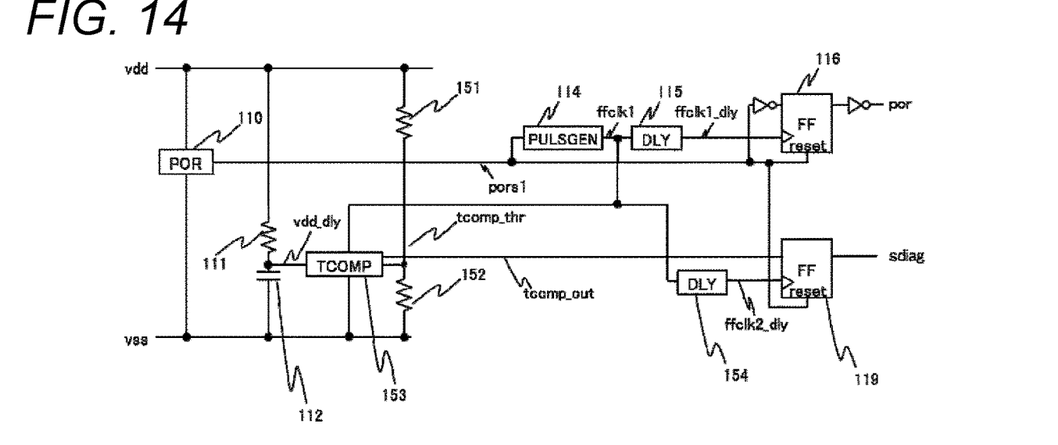
FIG. 14 illustrates an example of a circuit for distinguishing between the power-on case and the power abnormality case.

Under such circumstances, FIG. 14 illustrates a circuit configuration in which recovery time does not extend even when the delay of vdd_dly is large. Only differences from the first embodiment will be described.

A TCOMP 153 compares vdd_dly with tcomp_thr while ffclk1 is high to output a high-value signal when vdd_dly is lower than tcomp_thr and output a low-value signal when vdd_dly is higher than tcomp_thr. An output signal tcomp_out of the TCOMP 153 is input in the FF 119. Resistors 151 and 152 generate tcomp_thr by deriving a voltage ratio thereof. A DLY 154 generates a delay signal ffclk2_dly of ffclk1. The delay signal ffclk2_dly is a clock signal of the FF 119 and is delay for adjusting timing of taking tcomp_out in the FF 119.

Figure 15:
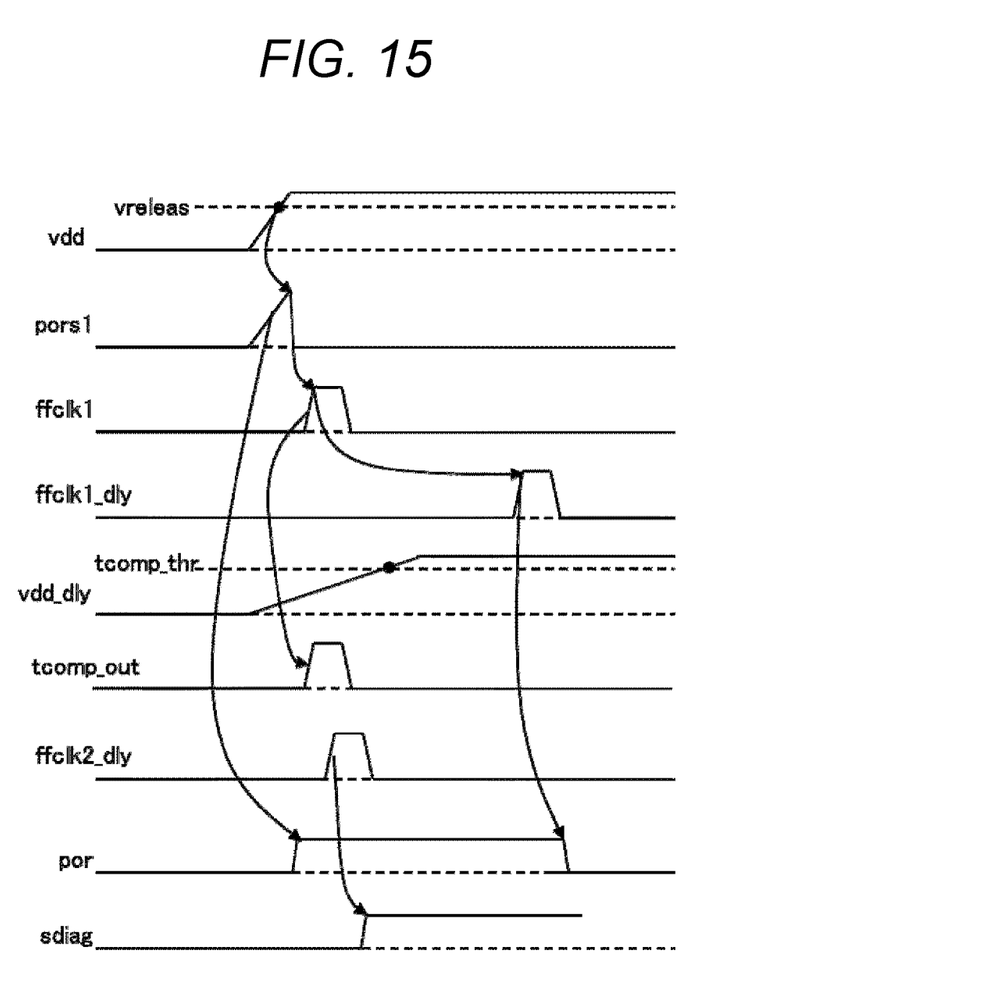
FIG. 15 illustrates operation waveforms of the circuit illustrated in FIG. 14 in the power-on case.

FIG. 15 illustrates operation waveforms in the power-on case. Along with rising of vdd, pors1 rises. When vdd reaches vreleas, pors1 falls, and a pulse signal is generated in ffclk1. When ffclk1 rises, a por signal rises. When ffclk1 rises, the TCOMP 153 compares vdd_dly with tcomp_thr. Since a voltage value of vdd_dly is lower than tcomp_thr, a high-value signal is output to tcomp_out. While ffclk1 rises, and a determination value is output to tcomp_out, ffclk2_dly rises, the value of tcomp_out is taken in the FF 119, and an output sdiag of the FF 119 gets high. Since sdiag is high, the IC performs the initial diagnosing operation.

Figure 16:
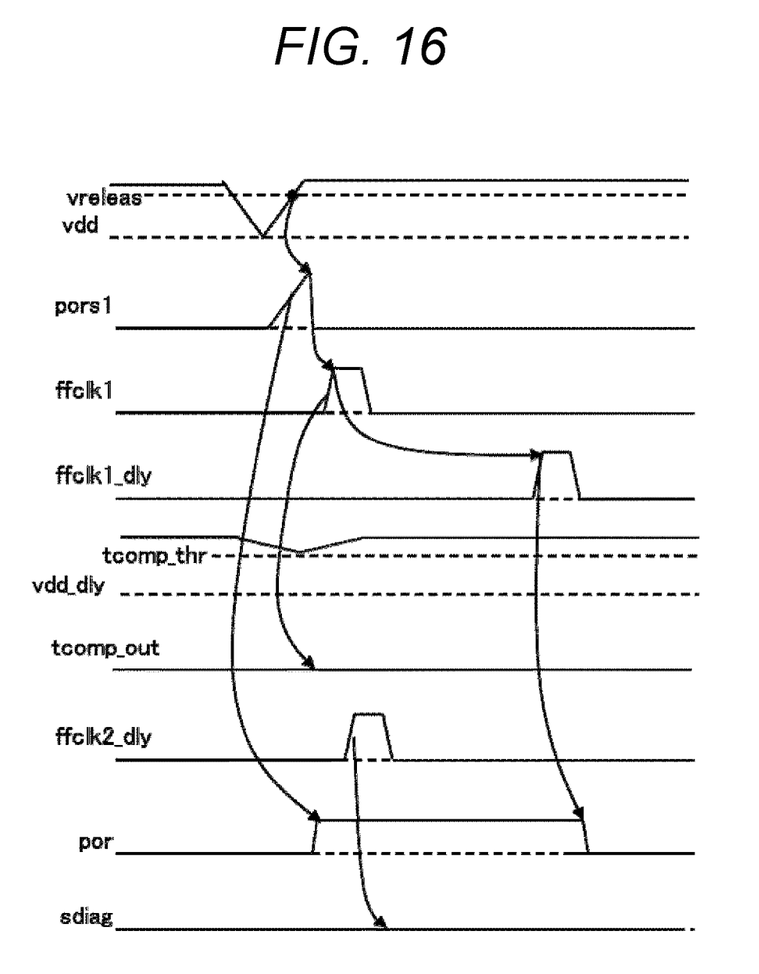
FIG. 16 illustrates operation waveforms of the circuit illustrated in FIG. 14 in the power abnormality case.

FIG. 16 illustrates operation waveforms in the power abnormality case. Since vdd_dly is higher than tcomp_thr at the time of activation of ffclk1, a low-value signal is output to tcomp_out. While ffclk1 rises, and a determination value is output to tcomp_out, ffclk2_dly rises, and the value of tcomp_out is taken in the FF 119. However, since tcomp_out is low, an output sdiag of the FF 119 keeps low. Since sdiag is low, the IC starts the normal operation without performing the initial diagnosing operation.

In the first embodiment, in a case in which the power abnormality, in which power-supply voltage decrease time is long, is distinguished from the power-on, delay of vdd_dly against a change of the power-supply voltage vdd needs to be large. Thus, since it takes time to determine the power-on or the power abnormality, it takes time for recovery from the power abnormality. Conversely, in the present embodiment, determination can be performed when the power supply recovers normal operation voltage.

REFERENCE SIGNS LIST

100 semiconductor chip
101 control signal generating circuit
102 circuit block
103 memory device
104 register
105 analog circuit block
106 microprocessor
107 input/output interface from/to an external unit
110, 112, 141, 142 circuit generating a signal at the time of rising of input power supply
114, 117 pulse signal generating circuit
115, 118 delay circuit
116, 119 flip-flop circuit
111 resistor
112 capacitor
121 comparator
122 PMOS switch
131 operational amplifier
143 counter circuit
144 comparator

The invention claimed is:

1. A semiconductor device for mounting on an automobile, comprising:
a control signal generating circuit that is configured to generate, depending on a fluctuation time of a power-supply voltage, a different control signal that distinguishes a power-on case and a power abnormality case, wherein the fluctuation time of the power supply voltage during the power abnormality case is caused by noise and chattering of a connector; and
a control circuit that is configured to select a power-on operation sequence or an abnormality operation sequence depending on the different control signal generated by the control signal generating circuit, wherein, only during the power-on operation sequence, an initial diagnosis operation of the semiconductor device is performed;
wherein the control signal generating circuit is configured to generate the different control signal depending on time of the power-supply voltage drop; and
wherein in the control signal generating circuit, potential between a resistor connected to the power-supply voltage and a capacitor connected to a ground is input as an input signal, and the control signal generating circuit is configured to output a high-value or low-value signal at time of rising of the input signal while voltage of the input signal is equal to or more than a preset voltage.

2. The semiconductor device according to claim 1, wherein in the control signal generating circuit, potential between a switch connected to the power-supply voltage and a capacitor connected to a ground is input as an input signal, and the control signal generating circuit is configured to output a pulse signal at time of rising of the input signal,
and the control signal generating circuit includes a comparator that is configured to compare voltage of the power-supply voltage of the output signal to control on/off of the switch.

3. The semiconductor device according to claim 1, comprising:
a circuit that is configured to output the different control signal to an outside.

4. The semiconductor device according to claim 1, wherein the control signal generating circuit is configured to generate the different control signal depending on different transition times of the power-supply voltage.

5. The semiconductor device according to claim 1, wherein
in the control signal generating circuit, potential between a resistor connected to the power-supply voltage and a capacitor connected to a ground, arbitrary preset voltage, and a timing signal is input, and
while the timing signal is input, the control signal generating circuit is configured to compare the potential between the resistor and the capacitor with the arbitrary preset voltage and outputs a high-value or low-value signal in accordance with a comparison result.

6. A semiconductor device for mounting on an automobile, comprising:
a control signal generating circuit that is configured to generate, depending on a fluctuation time of a power-supply voltage, a different control signal that distinguishes a power-on case and a power abnormality case, wherein the fluctuation time of the power supply voltage during the power abnormality case is caused by noise and chattering of a connector; and
a control circuit that is configured to select a power-on operation sequence or an abnormality operation sequence depending on the different control signal generated by the control signal generating circuit, wherein, only during the power-on operation sequence, an initial diagnosis operation of the semiconductor device is performed;
wherein the control signal generating circuit is configured to generate the different control signal depending on time of the power-supply voltage drop;
wherein the control signal generating circuit includes:
a first signal generating circuit in which potential between a resistor connected to the power-supply voltage and a capacitor connected to a ground is input as an input signal, and which is configured to output a pulse signal at a time of the input signal rising; and
a second signal generating circuit that is configured to output a pulse signal at time of rising of the power-supply voltage,
the semiconductor device comprising:
the control circuit that is configured to change the operation sequence depending on rising and falling timing of the pulse signals output by the first and second signal generating circuits.

7. The semiconductor device according to claim 6, wherein
when the second signal generating circuit is configured to generate the pulse signal, an operation of an analog circuit is started, and reset of a flip-flop inside the control signal generating circuit and readout of data from a non-volatile memory to a register are performed, and a state of an output signal of the first signal generating circuit is checked, and in a case in which a pulse signal is generated, an initial diagnosing operation is executed.

* * * * *